(12) United States Patent
Shen et al.

(10) Patent No.: US 11,297,748 B2
(45) Date of Patent: Apr. 5, 2022

(54) ELECTROMAGNETIC SHIELDING FILM

(71) Applicants:QING DING PRECISION ELECTRONICS (HUAIAN) CO., LTD, Huai an (CN); Avary Holding (Shenzhen) Co., Limited., Shenzhen (CN)

(72) Inventors: Fu-Yun Shen, Huai an (CN); Ming-Jaan Ho, New Taipei (TW); Hsiao-Ting Hsu, New Taipei (TW)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 637 days.

(21) Appl. No.: 16/021,308

(22) Filed: Jun. 28, 2018

(65) Prior Publication Data
US 2019/0320563 A1 Oct. 17, 2019

(30) Foreign Application Priority Data
Apr. 12, 2018 (CN) .......................... 201810326497.4

(51) Int. Cl.
*B32B 27/28* (2006.01)
*C09J 9/02* (2006.01)
(Continued)

(52) U.S. Cl.
CPC ............. *H05K 9/0084* (2013.01); *B32B 7/12* (2013.01); *B32B 27/281* (2013.01); *C09J 9/02* (2013.01);
(Continued)

(58) Field of Classification Search
CPC ............... H05K 9/0084; H05K 1/0218; H05K 2201/0715; H05K 2201/035; H05K 2201/0154; H05K 1/0216; H05K 9/0088; B32B 7/12; B32B 27/281; B32B 2255/10; B32B 2255/205; B32B 2307/212; B32B 2307/732; B32B 2307/748; B32B 7/06; B32B 27/34; B32B 27/065; B32B 2307/7265; B32B 2255/28;
(Continued)

(56) References Cited

U.S. PATENT DOCUMENTS 4,392,013 A * 7/1983 Ohmura ................ H01L 21/705
174/253
2001/0031372 A1* 10/2001 Ostolski ............... H05K 9/0083
428/570
(Continued)

FOREIGN PATENT DOCUMENTS

CN 204578887 U 8/2015
CN 103144377 B * 12/2015
(Continued)

*Primary Examiner* — John D Freeman
(74) *Attorney, Agent, or Firm* — ScienBiziP, P.C.

(57) ABSTRACT

A film shielding against electromagnetic interference comprises an insulating layer, a silver layer, and a conductive adhesive layer. The insulating layer is made of polyimide. The metal layer is formed on the insulating layer. The conductive adhesive layer is coated on the metal layer and is very thin but renders the film less prone to bubbling and rupturing when in place.

4 Claims, 3 Drawing Sheets

(51) Int. Cl.
  *C09J 163/00* (2006.01)
  *B32B 7/12* (2006.01)
  *H05K 1/02* (2006.01)
  *H05K 9/00* (2006.01)
  *C08K 3/08* (2006.01)

(52) U.S. Cl.
  CPC .......... *C09J 163/00* (2013.01); *H05K 1/0218* (2013.01); *B32B 2255/10* (2013.01); *B32B 2255/205* (2013.01); *B32B 2307/212* (2013.01); *C08K 2003/085* (2013.01); *C08K 2003/0806* (2013.01); *C08L 2205/025* (2013.01); *H05K 2201/0154* (2013.01); *H05K 2201/035* (2013.01); *H05K 2201/0715* (2013.01)

(58) Field of Classification Search
  CPC .............. B32B 2457/08; B32B 2307/54; C09J 163/00; C09J 9/02; C09J 7/29; C09J 2479/086; C09J 2301/122; C09J 2301/314; C08L 2205/025; C08K 2003/0806; C08K 2003/085
  See application file for complete search history.

(56) References Cited

U.S. PATENT DOCUMENTS

| | | | | |
|---|---|---|---|---|
| 2009/0110843 | A1* | 4/2009 | Halahmi | C09D 11/103 427/511 |
| 2015/0305144 | A1* | 10/2015 | Tajima | B32B 15/08 174/350 |
| 2016/0113162 | A1* | 4/2016 | Lin | H05K 9/0088 428/40.7 |

FOREIGN PATENT DOCUMENTS

| | | |
|---|---|---|
| CN | 205847841 U | 12/2016 |
| CN | 206350297 U | 7/2017 |

\* cited by examiner

ELECTROMAGNETIC SHIELDING FILM

FIELD

The subject matter relates to electromagnetic shielding.

BACKGROUND

Electromagnetic interference may arise from external devices, but shielding may prevent electronic components from being affected or interfered with. This is an indicator of product quality. As network communication speeds continue to increase, portable terminal devices such as smart phones require better and better shielding against ultrahigh frequency (UHF) signals (1 Ghz to 50 Ghz). Such shielding is usually through the use of electromagnetic shielding films installed in electronic devices. In general, an electromagnetic shielding film comprises a metal layer, a glue layer, and a protective layer. The protective layer is made of thermoplastic polyurethane.

With the miniaturization of electronic components and the diversification of functions, the size of flexible circuit boards has been continuously reduced, and the number of layers of the circuits has been continuously increasing. There is a demand for the application of electromagnetic shielding films in high-level environments. However, in a highly stacked flexible circuit board (greater than 50 microns), the electromagnetic shielding film can include ruptures or bubbles.

BRIEF DESCRIPTION OF THE DRAWINGS

Implementations of the present disclosure will now be described, by way of example only, with reference to the attached figures.

DETAILED DESCRIPTION

Figure 1:
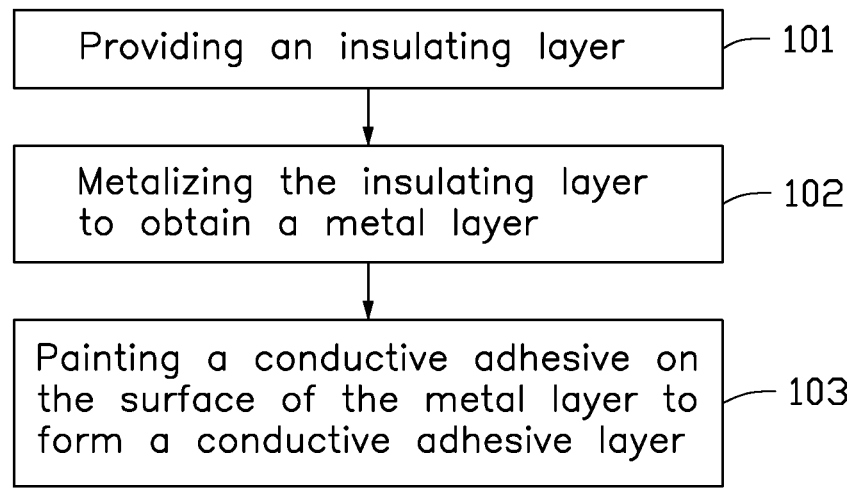
FIG. 1 is a flowchart showing a method for manufacturing an electromagnetic shielding film in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details.

In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

One definition that applies throughout this disclosure will now be presented.

The term "substantially" is defined to be essentially conforming to the particular dimension, shape, or other feature that the term modifies, such that the component need not be exact. For example, "substantially rectangular" means that the object resembles a rectangle, but can have one or more deviations from a true rectangle.

The term "comprising," when utilized, means "including, but not necessarily limited to"; it specifically indicates open-ended inclusion or membership in the so-described combination, assembly, series, and the like.

Referring to the FIG. 1, a method for manufacturing an electromagnetic shielding film 100 (shown in FIG. 4) is illustrated. The method is provided by way of example, as there are a variety of ways to carry out the method. Each block shown in the figure represents one or more processes, methods, or subroutines, carried out in the method. Furthermore, the illustrated order of blocks is by example only, and the order of the blocks can change. Additional blocks may be added or fewer blocks may be utilized, without departing from this disclosure. The method can begin at block 101.

Figure 2:
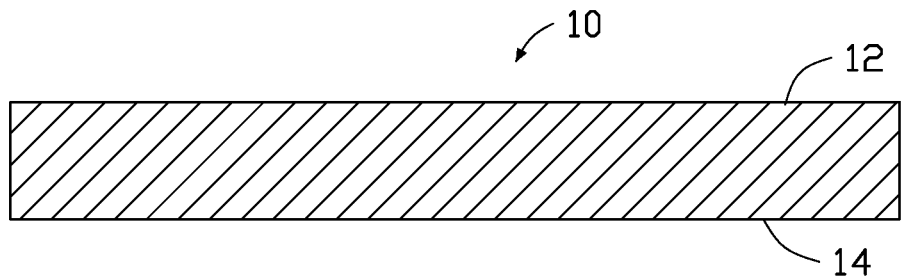
FIG. 2 is a cross sectional view of an insulating layer of an embodiment of the present disclosure.

At block 101, referring to the FIG. 2, an insulating layer 10 is provided.

The insulating layer 10 comprises a first surface and a second surface. Typically, the first surface is an upper surface 12 and the second surface is a lower surface 14. The upper surface 12 and the lower surface 14 are the opposite sides of the insulating layer 10. A thickness of the insulating layer 10 is between 5 and 35 microns. In the embodiment, the insulating layer 10 is made of polyimide (PI).

Figure 3:
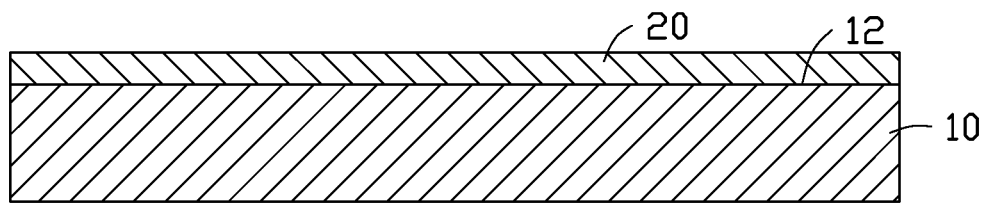
FIG. 3 a cross sectional view of a metallized insulating layer (silver) of an embodiment of the present disclosure.

At block 102, referring to the FIG. 3, the insulating layer 10 is metallized to obtain a metal layer 20. A thickness of the metal layer 20 ranges from 0.1 to 0.5 microns. In the embodiment, the metal layer 20 is a silver layer. The metallization process uses silver.

The upper surface 12 is first subjected to a surface treatment to form a metallized surface. The surface treatment comprises any combination of physical oxidation, chemical oxidation, chemical grafting, electrical grafting, photochemical grafting, and silanization modification. The metallization treatment may be any one of electrostatic adsorption or electroless plating.

When the electrostatic adsorption is used, the reactants added are silver nanocrystals (AgNPs), and main component of the catalyst is nano silver single substance. The upper surface 12 adsorbs AgNPs by charge modification to form the metal layer 20.

When an ion reaction is used, the added reactant is silver ion, and the main components of the catalyst are $AgNO_3$, $Ag(NH_3)_2NO_3$, $AgClO_4$, AgOAc. The upper surface 12 adsorbs silver ions by way of charge modification and forms a metal layer 20 on the upper surface 12 through a series of reduction reactions.

In other embodiments, when the ion reaction is used, the added reactants are silver ions and copper ions. The main components of the catalyst are $AgNO_3$ and $CuCl_2$, and the upper surface 12 adsorbs silver ions and copper ions through charge modification, and then a copper-silver alloy is formed on the upper surface 12 through a series of reduction reactions, to form the metal layer 20.

In other embodiments, a copper layer may be further applied on the metal layer 20 to form a thicker metal layer (not shown).

Figure 4:
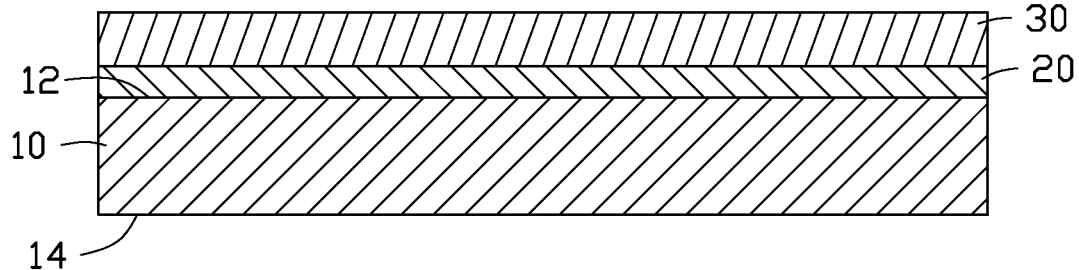
FIG. 4 is a top view of a conductive layer formed on the metallized layer of FIG. 3.

At block 103, referring to the FIG. 4, a conductive adhesive is applied on the surface of the metal layer 20 to form a conductive adhesive layer 30, thereby forming an electromagnetic shielding film 100.

A thickness of the conductive adhesive layer 30 ranges from 8 to 40 microns. In the embodiment, the conductive adhesive layer 30 comprises bisphenol A diglycidyl ether with a mass percentage between 9.8% and 10.5%, bisphenol S diglycidyl ether with a mass percentage between 4.54% and 4.86%, bisphenol F diglycidyl ether with a mass percentage between 2.27% and 2.43%, polyamide with a mass percentage between 7.11% and 7.62%, silver copper powder with a mass percentage between 48.6% and 68.3%, and strips with a mass percentage between 6.44 and 25.9%. The strips are made of silver.

Among the above, the bisphenol A diglycidyl ether is configured to increase the connectivity, flexibility, and chemical resistance of the conductive adhesive layer 30. The bisphenol S diglycidyl ether is configured to increase the connectivity and heat resistance of the conductive adhesive layer 30. The bisphenol F diglycidyl ether acts as a bifunctional diluent. The polyamide is configured as a curing agent. In other embodiments, dicyandiamide may also be selected as a curing agent. The silver copper powder and the silver strips all play a role in conducting electricity. The higher the content of the silver copper powder and the silver strips, the lower the resistivity of the conductive adhesive layer 30. However, an excessive amount of the powder may cause unsatisfactory dispersion of the conductive adhesive layer 30, and poor printing operation performance. Therefore, the content of the silver copper powder is suggested to be maintained between 48.6% and 68.3%, and the silver strips content is between 6.44% and 25.9%.

The following table shows three examples of the conductive adhesive layer 30 that have been tested to meet the goals described above.

|  | EXAMPLE | | | |
| --- | --- | --- | --- | --- |
|  | EXAMPLE I | EXAMPLE II | EXAMPLE III | Range of Ratio |
| DGEBA (Bisphenol A diglycidyl ether) | 6.5 g | 6.5 g | 6.5 g | 10.0 ± 0.3 wt % |
| DGEBS (Bisphenol S diglycidyl ether) | 3.0 g | 3.0 g | 3.0 g | 4.7 ± 0.13 wt % |
| BEF-170 (Bisphenol F diglycidyl ether) | 1.5 g | 1.5 g | 1.5 g | 2.3 ± 0.13 wt % |
| Polyamide | 4.7 g | 4.7 g | 4.7 g | 7.4 ± 0.3 wt % |
| Silver copper powder | 42.4 g | 42.4 g | 30.0 g | 53.3 ± 15.0 wt % |
| Silver strip | 4.0 g | 8.0 g | 16 g | 16.0 ± 10.0 wt % |
| Total | 62.1 g | 66.1 g | 61.7 g | 100% |

The bisphenol A diglycidyl ether, bisphenol S diglycidyl ether, bisphenol F diglycidyl ether, polyamide, silver copper powder, and silver tablets are mixed and dissolved in a solvent to form the conductive adhesive layer 30.

To satisfy the range of the proportions of each component, the parameter weight of the example can be adjusted, and is not limited thereto.

Referring to FIG. 4, the electromagnetic shielding film 100 comprises the insulating layer 10, the metal layer 20, and the conductive adhesive layer 30. The insulating layer 10 is made of polyimide. The metal layer 20 is formed on the surface of the insulating layer 10. The chemical composition of the metal layer 20 is silver. The conductive adhesive layer 30 is coated on the surface of the metal layer 20. A thickness of the electromagnetic shielding film 100 is maintained between 13 and 75 microns. The transverse tensile strength of the electromagnetic shielding film 100 is greater than 160 MPa, and the longitudinal tensile strength is greater than 130 MPa. The electromagnetic shielding film 100 can be extended between 60 and 120%. The peeling strength of the electromagnetic shielding film 100 is greater than 0.6 kg/cm. The bending limit of the electromagnetic shielding film 100 is more than 10,000 times.

Figure 5:
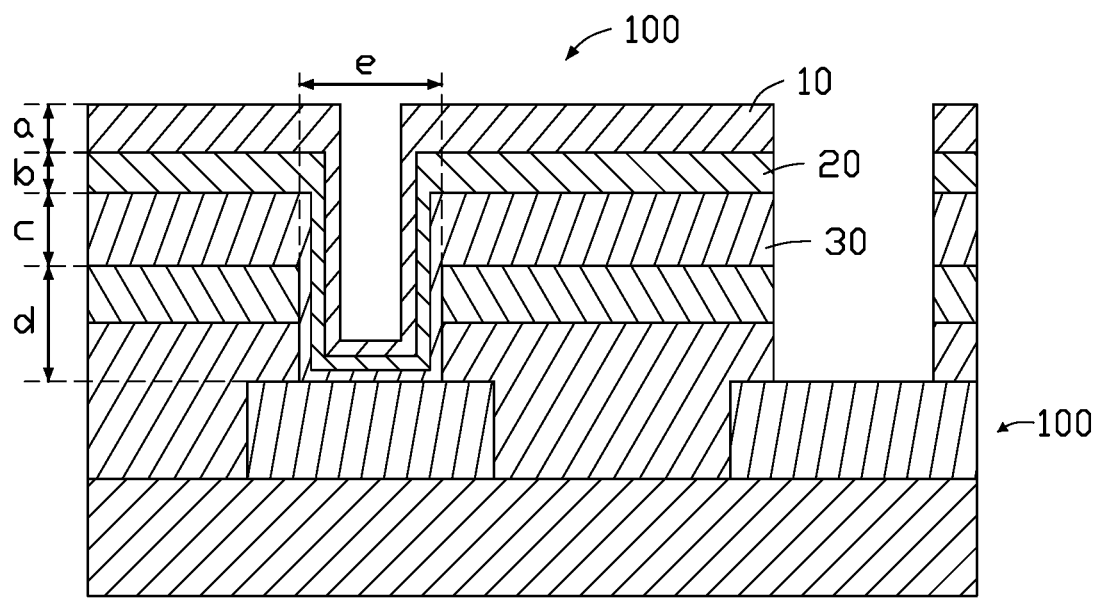
FIG. 5 is a cross sectional view of an electromagnetic shielding film overlaid on a circuit board.

Referring to FIG. 5, the electromagnetic shielding film 100 is applied to a circuit board 200 having a high drop. The circuit board 200 has a height difference, the distance is greater than 0.8 mm, and the height d is in the range of 0-100 microns. The electromagnetic shielding film 100 is attached to the circuit board 200 and covers the height difference. At this time, the conductive adhesive layer 30 is attached to the surface of the circuit board 200, and the insulating layer 10 faces away from the circuit board 200. After the electromagnetic shielding film 100 is laid on the circuit board 200, the thickness of the insulating layer is maintained between 5 and 35 microns, and the thickness of the metal layer is maintained between 0.1 and 0.5 microns. The thickness of the conductive adhesive layer is maintained between 8 and 40 microns.

The electromagnetic shielding film 100 is manufactured by metallizing silver and copper on the insulating layer 10 (polyimide) after applying the coating of conductive adhesive. The electromagnetic shielding film 100 uses the insulating layer 10 as an outer protective layer, the film 100 has good peel strength, softness, and low rebound force, so it will not crack or generate bubbles in a product component. In addition, since the elongation rate of polyimide is between 70 and 90%. High tear strength of polyimide makes it less prone to breaking during tear-off of release papers. Furthermore, PI has lower water absorption (0.3-0.4%).

The embodiments shown and described above are only examples. Many other details are often found in the art. Therefore, many such details are neither shown nor described. Even though numerous characteristics and advantages of the present disclosure have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:
1. An electromagnetic shielding film comprising:
a polyimide insulating layer;
a silver layer, formed on the insulating layer;
a conductive adhesive layer, wherein the conductive adhesive layer is coated on the silver layer; the conductive adhesive layer comprises bisphenol A diglycidyl ether with a mass percentage between 9.8% and 10.5%, bisphenol S diglycidyl ether with a mass percentage between 4.54% and 4.86%, bisphenol F diglycidyl ether with a mass percentage between 2.27% and 2.43%, polyamide with a mass percentage between 7.11% and 7.62%, silver copper powder with a mass percentage between 48.6% and 68.3%, and silver strips with a mass percentage between 6.44% and 25.9%; and
wherein the sum of the mass percentages is 100%.

2. The electromagnetic shielding film of claim 1, further comprising a copper layer, the copper layer is thicker than the silver layer.

3. The electromagnetic shielding film of claim 1, wherein a thickness of the electromagnetic shielding film is between 13 and 75 microns, a thickness of the insulating layer is between 5 and 35 microns, a thickness of the silver layer is between 0.1 and 0.5 microns, a thickness of the conductive adhesive layer is between 8 and 40 microns.

4. The electromagnetic shielding film of claim 1, wherein the silver layer is formed on the insulating layer by any of electroplating, electroless plating or electrostatic adsorption.

\* \* \* \* \*